United States Patent [19]
Ryum et al.

[11] Patent Number: 5,696,007
[45] Date of Patent: Dec. 9, 1997

[54] METHOD FOR MANUFACTURING A SUPER SELF-ALIGNED BIPOLAR TRANSISTOR

[75] Inventors: Byung-Ryul Ryum; Tae-Hyeon Han; Deok-Ho Cho; Soo-Min Lee; Kwang-Eui Pyun, all of Daejeon, Rep. of Korea

[73] Assignees: Electronics and Telecommunications Research Institute, Daejeon; Korea Telecommunication Authority, Seoul, both of Rep. of Korea

[21] Appl. No.: 729,840

[22] Filed: Oct. 15, 1996

[30] Foreign Application Priority Data

Dec. 20, 1995 [KR] Rep. of Korea .............. 95-52693

[51] Int. Cl.$^6$ .............................. H01L 21/265
[52] U.S. Cl. .............. 437/31; 437/126; 437/131; 437/132; 437/90; 148/DIG. 72
[58] Field of Search .............. 437/31, 32, 126, 437/131, 132, 90; 148/DIG. 72

[56] References Cited

U.S. PATENT DOCUMENTS

| | | | |
|---|---|---|---|
| 4,829,015 | 5/1989 | Schaber et al. | 437/31 |
| 4,829,016 | 5/1989 | Neudeck | 437/31 |
| 5,106,767 | 4/1992 | Comfort et al. | 148/DIG. 102 |
| 5,424,227 | 6/1995 | Dietrich et al. | 437/31 |
| 5,484,737 | 1/1996 | Ryum et al. | 437/31 |

Primary Examiner—Tuan H. Nguyen
Attorney, Agent, or Firm—Antonelli, Terry, Stout & Kraus, LLP.

[57] ABSTRACT

The invention relates to a method for manufacturing a super self-aligned heterojunction bipolar transistor which is capable of miniaturizing an element, simplifying the process step thereof by employing a selective collector epitaxial growth and a polycide base electrode without using a trench for isolating between elements, thereby enhancing the performance thereof, which comprises the steps of: forming sequently a first oxidation film, an electrically conducting thin film and a second oxidation film on top of a substrate; patterning the second oxidation film and the conducting thin film to form a preliminary spacer; removing an exposed portion of the first oxidation film, and selectively growing a collector layer; oxidizing the collector layer to form a thermal oxidation film, and removing the preliminary spacer; depositing a polysilicon and forming a silicon oxidation film and a polysilicon spacer on the second oxidation film and the removed portion of the preliminary spacer, respectively; exposing the base thin film, the spacer and the collector layer to form a SiGe/Si layer; forming a base electrode on the SiGe/Si layer; exposing a portion of the first oxidation film and forming a third oxidation film; exposing a surface of the SiGe/Si layer and forming a oxidation spacer on sides of an etched portion, then self-aligning the emitter and the emitter electrode; and performing a metal wiring process.

8 Claims, 6 Drawing Sheets

METHOD FOR MANUFACTURING A SUPER SELF-ALIGNED BIPOLAR TRANSISTOR

FIELD OF THE INVENTION

The present invention relates to a method for manufacturing a self-aligned bipolar transistor; and, more particularly, to a method for manufacturing a self-aligned heterojunction bipolar transistor through the use of a selective collector epitaxial growth process and a polycide base electrode.

BACKGROUND OF THE INVENTION

Generally, even though the bipolar transistor previously disclosed has an improved operating speed according to miniaturization of a heterjunction bipolar transistor, since, to accomplish this, an impurity concentration between an emitter and a base should be increased, improvements of characteristics thereof based on a structure of such transistor is a difficult task.

There has been proposed a heterojunction bipolar transistor to solve the above shortcoming.

Such heterojunction bipolar transistor has a characteristic that energy bandgap of an emitter is larger than that of a base. For this reason, utilizations of the heterojunction bipolar transistor provide an improvement of the performance of the transistor regarding various design effects in comparison to the heterojunction bipolar transistor. In addition, in the manufacturing process associated with the heterojunction bipolar transistor previously described, there has been developed a method of decreasing the energy bandgap by adding germanium to a base layer composed of silicon.

As a conventional heterojunction silicon bipolar transistor, the prior art heterojunction bipolar transistors utilize a poly-silicon thin film as both a base electrode and an impurity diffusion source for an emitter.

Thus, using Ge instead of Si in the base layer, a difference between an energy bandgap of the emitter and that of the base occurrs to increase an emitter implantation efficiency. Then the base is grown to a high doping concentration ultra-thin film, thereby enhancing a current gain and a switching speed of transistor.

According to the optimization and the miniaturization of the structure of transistor, there have been recently utilized various methods to minimize several parasitic, effects such as base resistance causing at an active region of the element and a parasitic capacitance between the collector and the base.

Examples of such various methods are trench element isolation, a local oxidation of silicon("LOCOS"), a selective epitaxial growth("SEG") of a SiGe base thin film, and a selective epitaxial growth for a Si emitter and so on.

There have been studied a self-aligned Si/SiGe heterojunction bipolar transistor which self-alignment between the base and the emitter to reduce the base parasitic resistance, or self-alignment both between the base and the emitter, and between the collector and the base, through the use of the above methods.

Furthermore, in order to further reduce the base parasitic resistance resulting from the poly-silicon thin film forming a base electrode material, developments in manufacturing process using as the base electrode a metallic thin film for example, $TiSi_2$, instead of the poly-silicon thin film have been performed.

The above local oxidation of silicon method has a shortcoming that a thermal oxidation film is horizontally formed with a thickness of a silicon thermal oxidation film, resulting in a limitation of the geometric reduction of the transistor.

There is shown in FIG. 1 an exemplary self-aligned Si/SiGe heterojunction bipolar transistor which utilizes the selective epitaxial growth method for a SiGe base thin film without using the LOCOS method.

Referring now to FIG. 1, there is shown a cross-sectional view of npn Si/SiGe heterojunction bipolar transistor which is self-aligned between the collector and the base by using the selective base epitaxial growth previously described, after the growth of a base thin film.

An $n^+$ buried silicon collector layer (1-2) of a high impurity layer is first formed on a p-type silicon substrate (1-1), and an n- silicon collector layer (1-3) of a low impurity layer is then grown on the layer (1-2).

Subsequently, a collector junction portion (1-4) is formed by implanting an n-type impurity ion thereon, and then a trench to isolate between elements is formed by a dry etching method, and, in turn, filling therein with a Boron Phosphorous Silica Glass("BPSG") insulating thin film (1-5) made of boron B and phosphorous P. The BPSG insulating thin film (1-5) is then flattened under high pressure.

In a subsequent step, an insulating film (1-6), a $P^+$ poly-silicon film (1-7), an insulating film (1-8) and a side insulating film (1-9) are formed by depositing and etching methods as shown in FIG. 1, and an n-type collector region (1-10) for enhancing characteristics of elements in a high current region is then formed by selectively ion implanting to only an active region of the element.

In an ensuing step, a SiGe base thin film (1-11) is selectively grown on only an exposed portion in the collector region (1-10) and the poly-silicon film (1-7), through the use of a gas source molecular beam technique, and then a poly-silicon film (1-12) is selectively grown on the remaining space, thereby providing a junction between the poly-silicon film (1-7) for a base electrode and the SiGe base thin film (1-11).

Therefore, self-alignment between the collector and the base can be performed, since a parasitic capacitance region formed between the collector and the base is not defined as a sensitive film and is limited only to a portion of a poly-silicon thin film (1-12).

Since, however, the parasitic capacitance region defined by the poly-silicon thin film (1-12) is determined from a horizontal wet etching for the insulating film (1-6), resulting in the degradation of the efficiency of the process in a uniformity and a reproduction aspects, thus causing the final degradation of the performance of the element.

In addition, the prior art method has a disadvantage that since the low speed selective epitaxial growth method is applied two times during the growth of the SiGe base thin film (1-11) and the poly-silicon thin film (1-12), and two thin film for example, the thin film (1-11) and the thin film (1-12), are used during the growth process thereof, resulting in a complicated manufacturing process, and further even if the poly-silicon thin film (1-12) is slightly grown on the thin film (1-11), it allows the final degradation of element performance, thereby making it difficult to control the process thereof. Thus, the prior art method is difficult to accomplish an effective manufacturing process and a simplified process step.

Furthermore, as shown in FIG. 1, the prior art method has a shortcoming that a trench structure for isolating between elements should be deeply formed so as to prevent the collector junction portion (1-4) from contacting between elements via the n⁻ collector thin film (1-3) on the n⁺buried Si collector layer (1-2) formed at the entire surface of a substrate, resulting in a larger space requirement to be filled with the insulating thin film (1-5), thus resulting in a bulkier element.

Turning now to FIG. 2, there are presented a cross-sectional view of a Si/SiGe heterojunction bipolar element manufactured by another method previously described, after the growth of a base thin film.

In the prior art shown in FIG. 2, both of the base and the collector thin films are grown through the use of a selective epitaxial growth method in contrast with the trench structure previously described, to thereby accomplish a simplified and an integrated manufacturing processes.

As illustrated in FIG. 2, an n⁺-type collector (2-2) is first formed on a p-type substrate (2-1), and then an insulating thin film (2-3) and a poly-silicon thin film (2-4) for a base electrode are sequently deposited thereon, thereafter, a base electrode region is defined by a sensitive film mask and etching of the poly-silicon thin film (2-4).

After the above step, a insulating thin film (2-5) is deposited thereon, and then the sensitive film mask, the insulating thin film (2-5), the poly-silicon thin film (2-4) and the insulating thin film (2-3) are defined as an active region by an etching process.

Subsequently, an n-type silicon thin film (2-6) for a collector, a SiGe thin film (2-7) for a base, and a silicon thin film (2-8) for an emitter are sequently grown through the application of impurity thereon.

During the growth of the thin films, (2-6), (2-7), and (2-8), as shown in FIG. 2, a polycrystalline or amorphous silicon thin films, (2-6-1), (2-7-1) and (2-81), are formed at each side thereof, respectively.

Thereafter, a siliside thin film (2-9) for a collector metal junction is formed, and a metal electrode (2-10) are then deposited to thereby produce a transistor.

However, the above transistor suffers from a drawback that since a current path through a sequence of the amorphous silicon thin films, (2-8-1), (2-7-1) and (2-6-1), can occurr, it can be prone to a short circuit between the collector and the emitter.

Likewise, current paths through a sequence of the amorphous silicon thin films, (2-8-1), (2-7-1), (2-6-1) and the n-type Si thin film (2-6), or through the thin film (2-6), the thin films, (2-7-1) and (2-6-1) can cause an emitter-base and a base-collector short circuit.

SUMMARY OF THE INVENTION

It is, therefore, a primary object of the present invention to provide a method for manufacturing a self-aligned bipolar transistor which is capable of miniaturization and simplifying the fabricating process by employing a selective collector epitaxial growth and a polycide base electrode, without designing a trench for isolation between elements, thereby enhancing the performance thereof.

In accordance with the present invention, there is provided a method for manufacturing a self-aligned heterojunction bipolar transistor comprising the steps of: (a) forming sequentially a first oxidation film, an electrically conducting film for a base and a second oxidation film on a semiconductor substrate to form a buried collector; (b) patterning the second oxidation film and the electrically conducting thin film, and forming a preliminary spacer at sides of an exposed portion of the second oxidation film and the electrically conducting film; (c) removing an exposed portion of the first oxidation film, and selectively growing a collector layer on a defined active region such that its height is approximately similar to that of the conducting film for the base; (d) oxidizing the collector layer to form a thermal oxidation film, and removing the preliminary spacer; (e) depositing a polysilicon on a semifinished structure obtained from said step (d), and forming a silicon oxidation film and a poly-silicon spacer on the second oxidation film and the removed portion of the preliminary spacer by using a thermal oxidation process, respectively; (f) exposing the conducting film, the spacer and the collector layer, and forming a SiGe/Si layer; (g) forming a base electrode on the SiGe/Si layer; (h) exposing a portion of the first oxidation film by using a mask defining the base electrode, and forming a third oxidation film; (i) exposing a surface of the SiGe/Si layer by using a mask defining an emitter region, and forming a insulating spacer on sides of the exposed portion, and selectively growing an emitter layer on the defined emitter region, and forming an emitter electrode on the emitter layer; and (j) performing a metal wiring process.

In addition, in the inventive method, the semiconductor substrate is preferably made of silicon single substrate, Si/SiGe/Ge heterojuction substrate, or Si/diamond/Si heterojuction substrate.

Preferably, the inventive method instead of the step (e) includes the step of forming a spacer composed of a polysilicon and a spacer composed of a single crystal silicon on a side portion adjacent to the conducting film and a side portion adjacent to the collector layer, by using the selective epitaxial growth at only the removed portion of the preliminary spacer, to thereby form a double-layer spacer structure.

In addition, the inventive method further includes: forming a SiGe layer at an interface of the SiGe/si base layer,30 thereby preventing the degradation of the performance of the transistor due to occurrence of a parasitic electric potential in the step (f).

In addition, in the inventive method, the base electrode is preferably made of a silicide metal deposited by sputtering, to thereby minimize a parasitic resistance in the base.

BRIEF DESCRIPTION OF THE DRAWINGS

The above and other objects and features of the present invention will become apparent from the following description of preferred embodiments, when taken in conjunction with the accompanying drawings, in which.

DETAILED DESCRIPTION OF THE PREFERRED EMBODIMENTS

Figure 3:
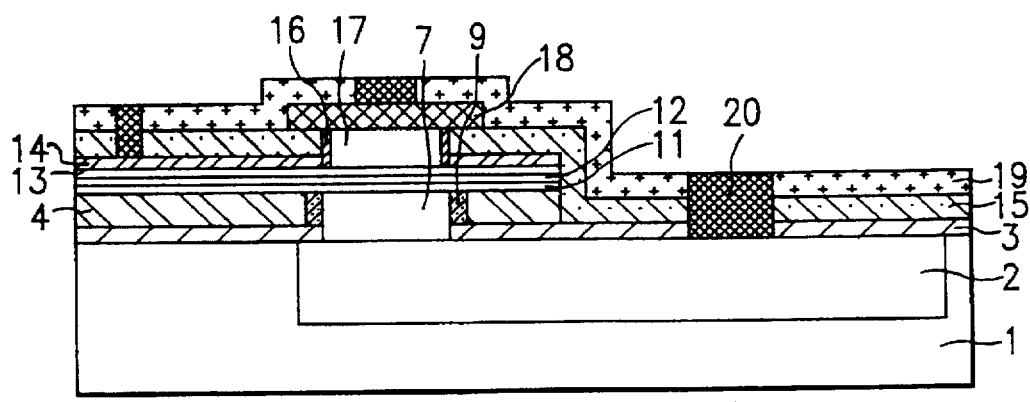
FIG. 3 illustrates a cross-sectional view of a self-aligned bipolar transistor manufactured in accordance with a preferred embodiment the present invention.

There are shown in FIG. 3 a cross-sectional view of a self-aligned bipolar transistor formed with a selective collector growth method in accordance with a preferred embodiment of the present invention.

In comparison with the above-mentioned methods(see, FIGS. 1 and 2), details of the advantages of the present invention will be illustrated below with reference to FIG. 3. First, a trench structure to isolate between elements should be deeply formed so as to prevent the (1-4) from contacting with elements through the n⁻Si collector layer (1-3), in the n⁺buried Si collector layer (1-2) deposited on the entire surface of the substrate, as shown in FIG. 1.

Figure 1:
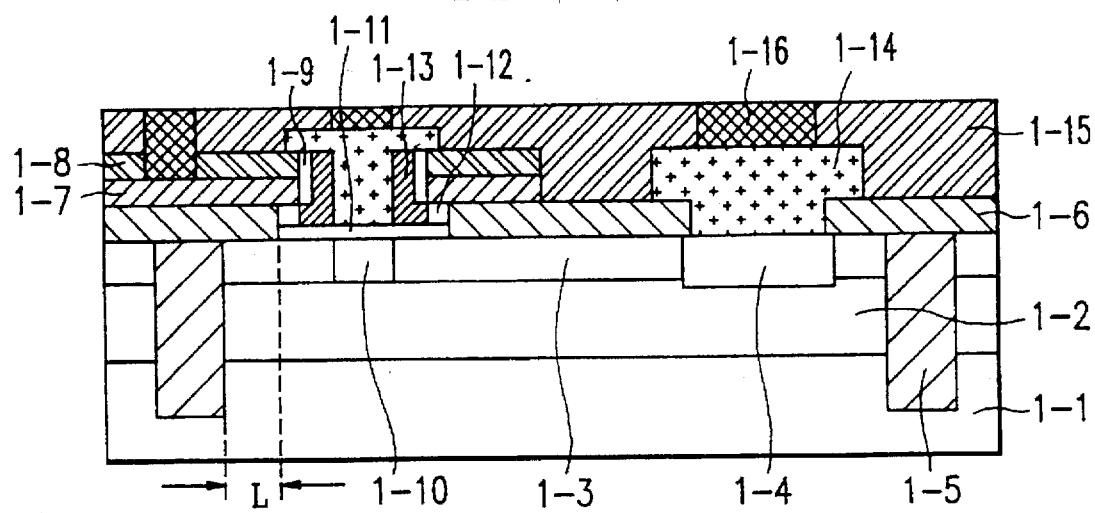
FIG. 1 shows a cross-sectional view of a self-aligned npn Si/SiGe heterojunction bipolar transistor which utilizes the selective base epitaxial growth method previously described.
Figure 2:
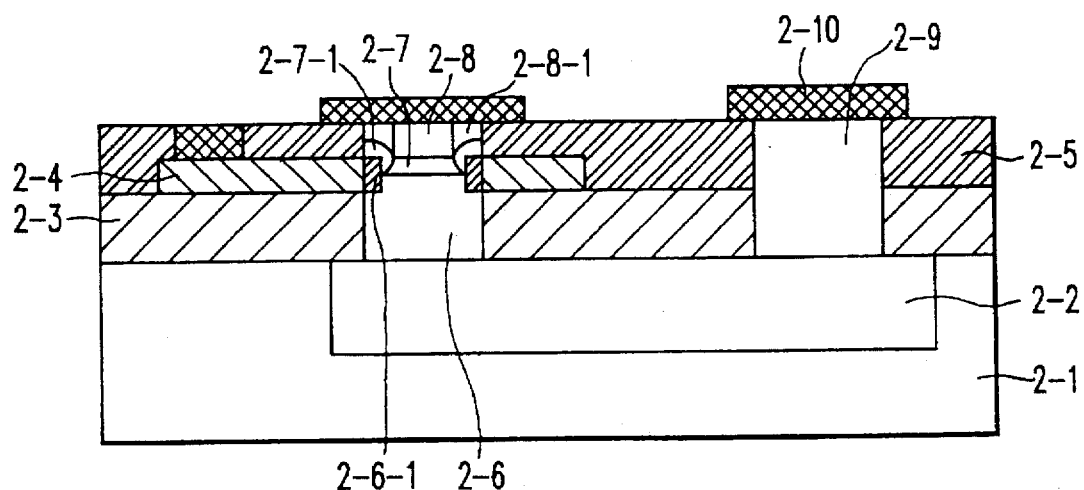
FIG. 2 presents a cross-sectional view of heterojunction bipolar transistor which self-aligns between the collector and the base by using another method previously described, after the growth of a base film.

As a result, a plane area for filling with the BPSG insulating thin film (1-5) is increased to thereby entail a bulkier element but, since each of the collector thin film (2-6) and a collector thin film 7 is separated from each other by the aid of the insulating thin film, (2-3) and 3, as shown in FIGS. 2 and 3, respectively, the trench process to isolate between elements in FIG. 1 may be eliminated.

Likewise, since each of self-alignments of base-collector and emitter-base are performed so that all of the emitter, the base and the collector has the same area as each other, it is possible to switch upward/downward operating modes, thereby making it reduce a parasitic capacitance between the base and the collector, and to provide self-alignment between the emitter and the base. Thus, cancellation of a process for isolation between elements results in a smaller element and further a simplified process step.

Secondly, in FIGS. 2 and 3, an useless region in FIG. 1(which is indicated by length L) is eliminated to miniaturize the size of the transistor, resulting in a possibility of high integration and a reduction of parasitic capacitance causing between an n⁺buried collector and a p-type substrate, thereby making it possible to enhance an operating speed of the element.

On the order hand, in comparison with the element shown in FIG. 2, the merits of the element shown in FIG. 3 will be discussed below.

First, in case of the element in FIG. 2, since a current path passing through the amorphous silicon thin films, (2-8-1), (2-7-1) and (2-6-1), can occurr, it can be prone to a collector - emitter short circuit effect relating not to a leakage current.

Similarly, since a current path through the amorphous silicon thin films, (2-8-1), (2-7-1), (2-6-1) and the n-type silicon thin film (2-6), or a series of the n-type silicon thin films, (2-6), (2-7-1) and (2-6-1) can occurr, an emitter-base and a base-collector short circuit can occurr. In practice the element associated with the structure shown in FIG. 2 is difficult to make.

Furthermore, when the n-type silicon thin film (2-6), i.e., collector thin film, is selectively grown, since the thin film (2-6-1) is grown from the sides of the collector thin film (2-6), the thicker the collector film (2-6) the greater the increase in the growth of the thin film (2-6-1) at the sides thereof is. As a result, a sequence of simple-crystal line films, (2-8), (2-7), (2-6) and (2-2), to be defined as an active region in the element may not be clearly determined.

In addition to the growth of both of the SiGe film (2-7) and the silicon thin film (2-8), since the films, (2-7-1) and (2-8-1), are also grown, a width of the active region in the element depends on a thickness of a sequence of the thin films, (2-6), (2-7) and (2-8).

In contrast to the transistor disclosed previously, the transistor in accordance with the present invention prevents a polysilicon side spacer 9 from invading the active region to be defined by a mask in the transistor, wherein the spacer 9 is formed between a poly-crystal silicon thin film 4 for a base electrode and a selectively grown collector silicon film 7, and its thickness is determined regardless of that of film 7. In addition, when a SiGe thin film 11, a silicon thin film 12 and a silicon thin film 13 are grown, the active region in the transistor is successively maintained According to the invention, isolation between an emitter thin film 17 and the polycrystalline films is derived by using a sensitive film mask defining an emitter region and a side insulating film 16. Thus, the invention can be less prone to a flow of leakage current or an emitter-base-collector short circuit as shown in FIG. 2.

Second, when a single p-type SiGe thin film layer is used as a base as shown in FIG. 2, a p-type impurity within the base thin film, during the growth of the emitter thin film (2-8), may be diffused to the collector and the emitter adjacent to the base, respectively.

Thus, discordance between a junction face of the silicon thin film (2-8), the SiGe thin film (2-7) and the n-type silicon thin film (2-6), i.e., the emitter-base-collector, and a junction face by the npn impurity occurrs. As a result, a parasitic electric potential is created at the junction faces between the emitter-the base and between the collector-the base, hence, the parasitic electric potential prevents an electron from transferring from the emitter to the collector, thereby degrading performance of the transistor such as a current amplification factor and a cutoff frequency and so on.

In accordance with the present invention, a SiGe thin film 11 and a silicon thin film 13 are formed on the top and the bottom of a p-type SiGe thin film 12, respectively, so as to overcome the degradation of the performance factors depending on generation of such parasitic electric potential.

Third, in the prior art transistor, since a thickness of the collector thin film in a high speed transistor is designed, to be thin, a thickness of both of the base electrode film (2-4) and the base thin film 4 shown in FIGS. 2 and 3 so that a parasitic resistance resulting from the base electrode film itself is further increased. The present invention provides a metallic silicide thin film 14 to minimize the parasitic resistance as shown in FIG. 3.

Fourth, in the structure shown in FIG. 2, since a selective epitaxial growth process to grow the SiGe thin film (2-7) is used, it has a shortcoming that it is difficult to manufacture thereof and it requires cumbersome processes, thereby degrading overall productivity.

In addition, the prior art structure causes the increase of parasitic resistance owing to a junction between the base electrode (2-4) and the base film (2-7) is performed at sides thereof.

Meanwhile, in accordance with the present invention, in the order hand, since a surface of the substrate is formed by the polycrystal line film 4 and the single crystal silicon film 7, the selective epitaxial growth for a multi-layer film for a base composed of Si/SiGe is not required, resulting in the reduction of processing time and further a contact between the multilayer film for the base on the base electrode 4, to thereby prevent the parasitic resistance in the base film from increasing.

As described hereinabove, in accordance with a preferred embodiment present invention, it is possible to overcome the above disadvantages according to the elimination of element isolation region and to control the parasitic capacitance between the collector and the base, and further to remarkably reduce the parasitic capacitance between the emitter and the base and the parasitic resistance in the base through a self-alignment between the base and the emitter, thereby improving operating characteristics of the transistor for high frequency operation.

Hereinafter, the manufacturing method of a self-aligned bipolar transistor in accordance with the present invention will be described with reference to FIGS. 4(A) to 4(J).

Figure 4A:
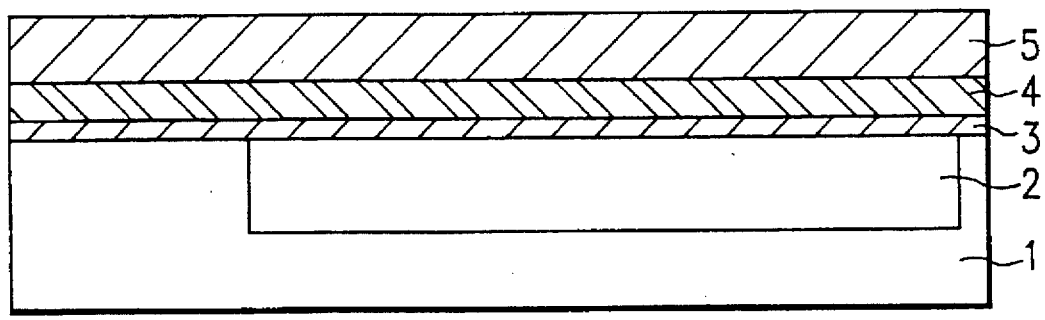
FIGS. 4(A), to 4(D) 4(D-1), 4(E)–4(G), 4(G-1), 4(H),4 (H-1),4(I) and 4(J) offer a schematic cross-sectional views setting forth the manufacturing steps for the self-aligned bipolar transistor in accordance with a preferred embodiment the present invention.

Referring to FIG. 4(A), there is shown a p-type semiconductor substrate 1 having a buried collector 2. The semiconductor substrate 1 is preferably composed of a single silicon substrate, a heterojuction substrate being made of Si/SiGe/Ge, or a heterojuction substrate being made of Si/diamond/Si. The above buried collector 2 is generally formed by photolithography, ion implantation and an annealing process.

Next, a first $SiO_2$ oxidation film 3 is deposited thereon.

Subsequently, a p-type conducting film 4 for a base such as polysilicon, SiGe and Ge is formed by using a chemical vapor deposition(CVD) method followed by an impurity ion implantation in-situ. Thereafter, a second $SiO_2$ oxidation film 5 is deposited on the polycrystalline conducting thin film 4.

Figure 4B:
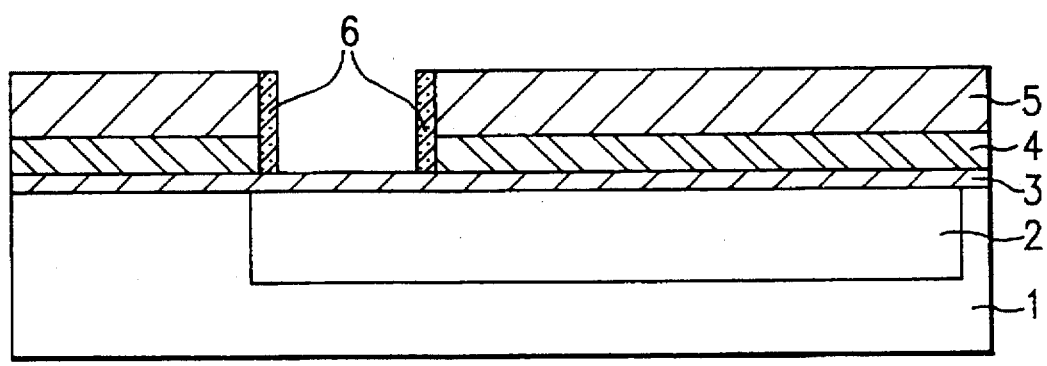

Referring to FIG. 4(B), the $SiO_2$ oxidation film 5 is etched by using a photoresist as a mask defining an active region in the element, and then the photoresist film is removed. In the following step, the p-type polycrystal silicon thin film 4 is etched and a silicon nitride film is then deposited thereon.

Thereafter, a preliminary spacer 6 is formed at both sides of the second oxidation film 5 and the conducting thin film 4 by using an anisotropic dry etching.

Figure 4C:
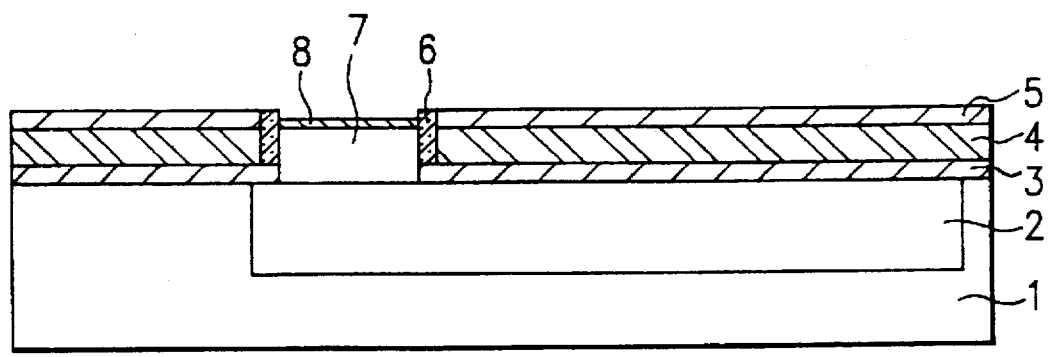

Referring to FIG. 4(C), in the above step, an exposed portion of the first $SiO_2$ oxidation film 3 in the active region is further etched, wherein the second $SiO_2$ oxidation film 5 is also etched as the etched thickness of first $SiO_2$ oxidation film 3, a single crystal collector layer 7 is selectively grown on only an exposed surface of the buried collector 2.

In this moment, the collector thin film 7 is doped by adding an n-type impurity or an ion implantation and the heat treatment after the growth of thin film. Thereafter, the second oxidation film 5 and the preliminary spacer 6 are etched at predetermined thickness, and then a thermal oxide 8 is formed by thermal oxidation of the collector layer 7.

Figure 4D:
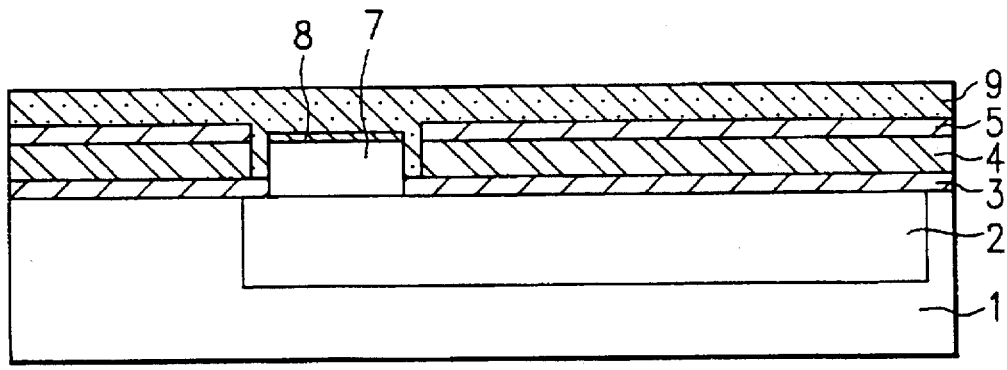
Figures 1, 4D:
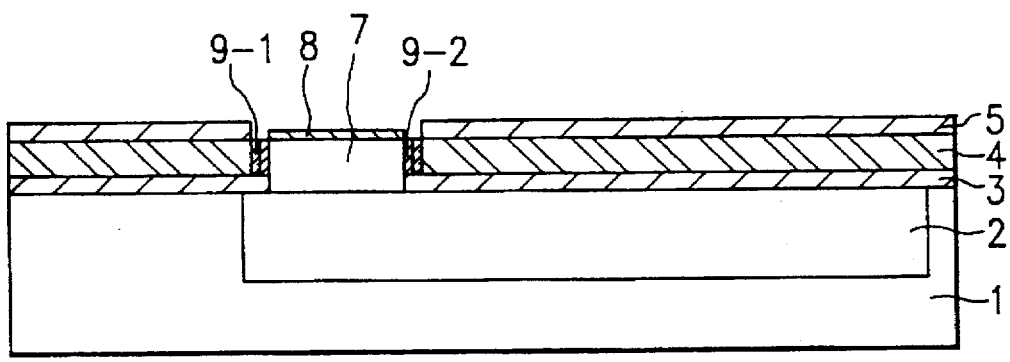

Referring to FIG. 4(D), the preliminary spacer 6 is removed by etching and a polysilicon 9 is then deposited thereon.

Figure 4E:
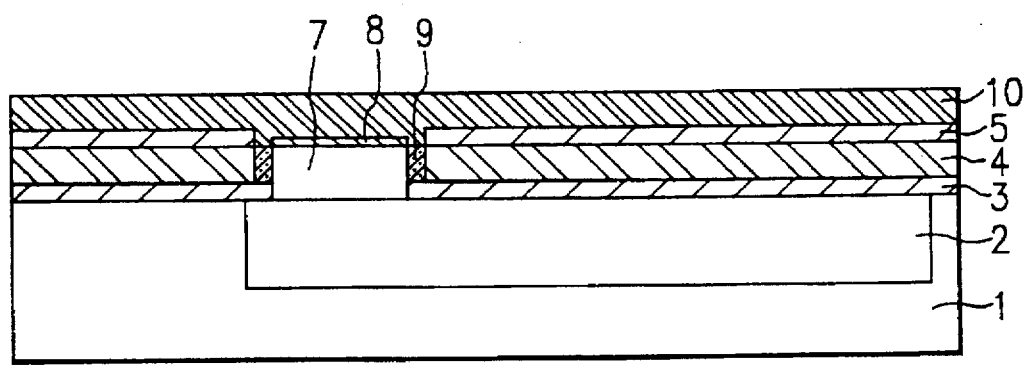

Next, by thermal oxidation, as shown in FIG. 4(E), a polysilicon is deposited on top of the second $SiO_2$ oxidation film 5 and a portion of the removed preliminary spacer 6, a thermal oxidation film 10 and a polysilicon spacer 9 are formed respectively.

At this time, instead of the above step by using selectively epitaxial growth, double-layer spacer may be formed as shown in FIG. 4(D-1). In this case, a spacer (9-1) composed of a polysilicon is formed on a side portion adjacent to the polysilicon thin film 4 and a spacer (9-2) composed of a single crystal silicon is formed on a side portion adjacent to the collector layer 7, to thereby form a multi-layer spacer structure.

Figure 4F:
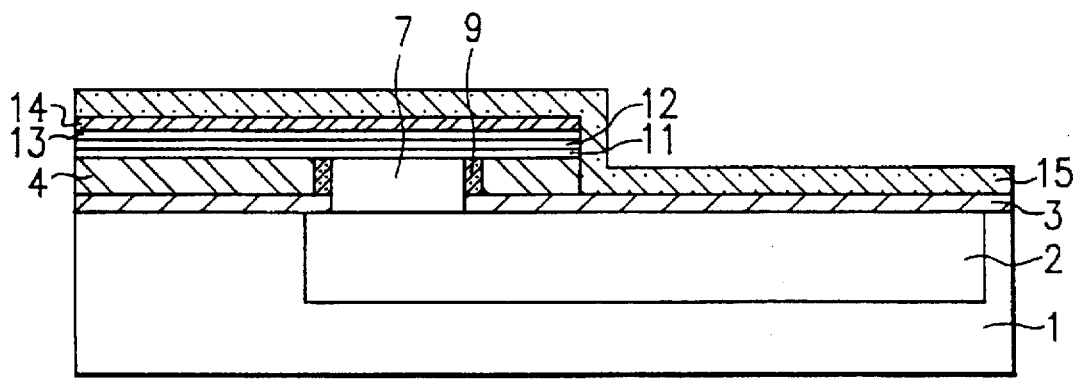

Referring to FIG. 4(F), a multi-layer base is grown on the second $SiO_2$ oxidation film 5 and the conducting thin film 4 is exposed by removing the thermal oxidation film 10. Preferablly, the multi-layer base is composed of non-doped SiGe layer 11, doped SiGe layer 12 and Si layer 13.

In the above step, an impurity addition to the SiGe thin film 11 is performed when the SiGe thin film 11 is epitaxially grown in-situ and an impurity is added to the silicon thin film 13 which is any one of the n-type or the p-type impurities.

In addition, the films, 11 and 12, or all of the films, 11, 12 and 13, may be replaced with a doped p-type silicon thin film doped in-situ.

In the above step, a polycrystalline film is grown on the conducting thin film 4 and the spacer 9 is made of polysilicon, while the single-crystal line film is grown on the collector layer 7.

In a subsequent step, a base electorde 14 is deposited on the silicon layer 13 by sputtering a metal or a metallic silicide for example, a titanium siliside, $TiSi_{2-x}$(X is 0 to 9). Thereafter, the thin films, 14, 13, 12, 11 and 4, are etched by using a mask defining the base electrode, and then the mask is removed, and in turn, a third oxidation film 15 is deposited thereon.

Figure 4G:
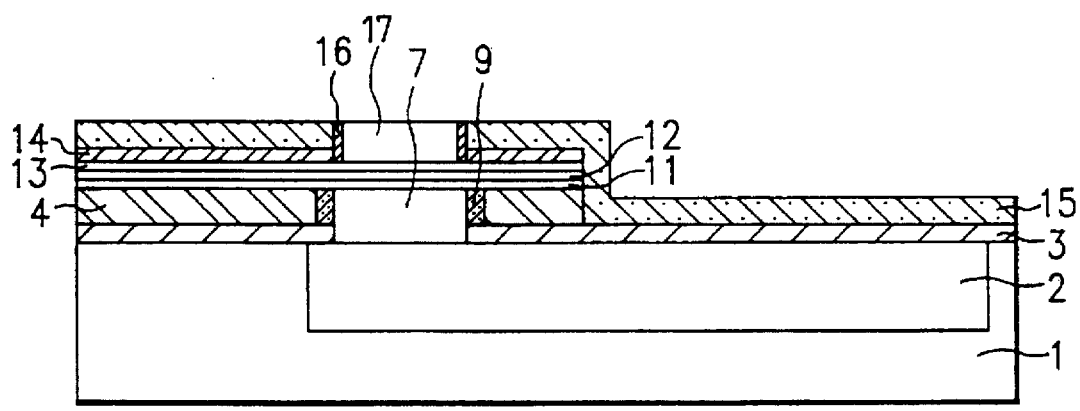
Figures 1, 4G:
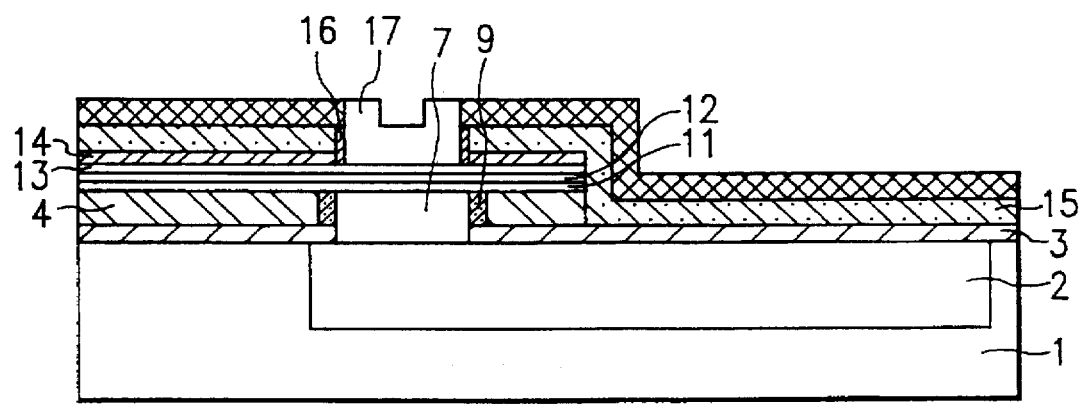

Referring to FIG. 4(G), the third oxidation film 15 and the base electrode 14 are etched by using a mask defining an emitter region, and an insulating film is deposited at both sides of the etched portion, and an insulating spacer 16 is formed by anisotropic etching the insulating film. Next, an emitter layer 17 is selectively grown only on the defined emitter region.

At this time, the emitter layer 17 can be also grown nonselectively as shown in FIG. 4(G-1).

Figure 4H:
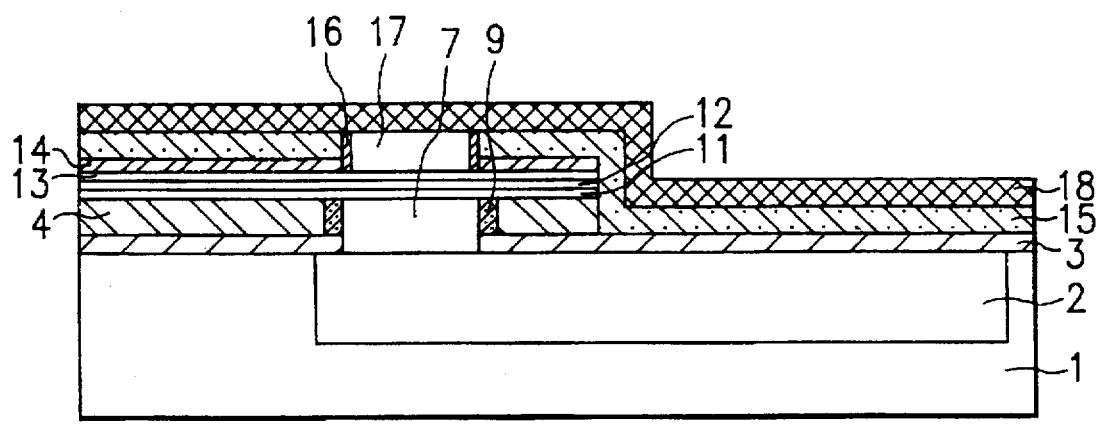
Figures 1, 4H:
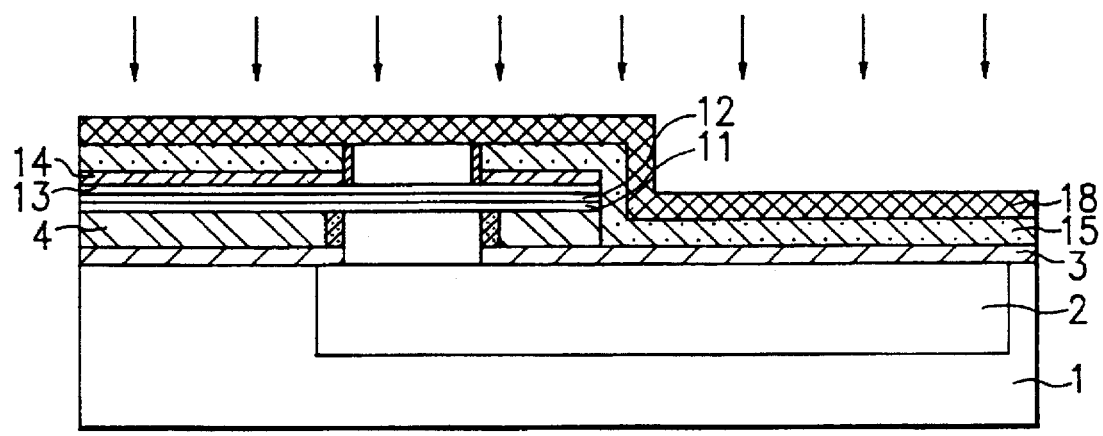

Referring to FIG. 4(H), a polysilicon doped with n-type impurities in-situ is deposited, or a non-doped polysilicon is deposited and then n-type impurities are ion implanted as shown in FIG. 4(H-1).

Figure 4I:
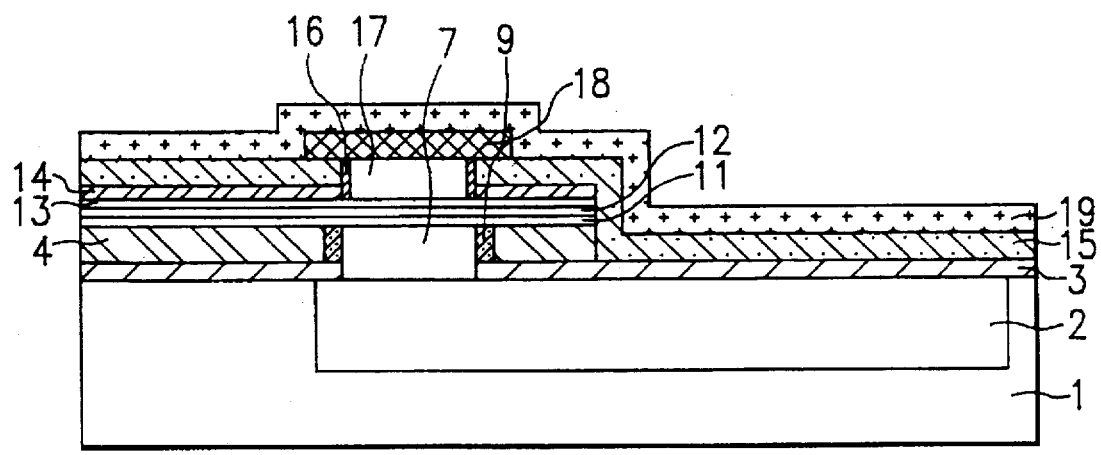

Referring to FIG. 4(I), the polysilicon is etched by using a mask defining an emitter electrode, to thereby form an emitter electrode 18. Next, a fourth $SiO_2$ oxidation film 19 is deposited on a structure obtained from the above step.

Figure 4J:
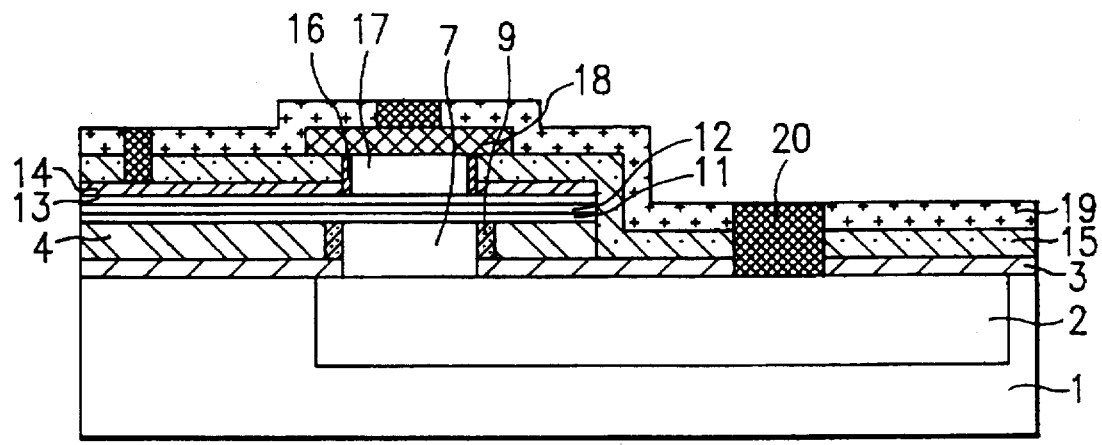

Finally, the fourth $SiO_2$ oxidation film 19 is patterned by using a mask defining a metal contact window, and then, a metal wiring 20 of a metal thin film for example, a double-layer structure of metal thin film AL-1% Si/TiW, is formed, to thereby obtain a bipolar transistor as shown in FIG. 4(J).

As mentioned above, the present invention has an advantage that the operating speed of a bipolar transistor can be increased using a Si/SiGe heterojunction thin film structure, and a parasitic capacitance and a parasitic resistance is reduced and the transistor is miniaturized, to thereby accomplish a high speed, a high integration and a low power consumption.

Furthermore, the invention in a high speed transition reduces the effect of a breakdown voltage between a collector and a base or between a collector and an emitter depending on a decrease in thickness of the collector and it is easier to manufacture thereof, to thereby enhance productivity.

While the present invention has been described with respect to certain preferred embodiments only, other modifications and variations may be made without departing from the scope of the present invention as set forth in the following claims.

What is claimed is:

1. A method for manufacturing a self-aligned heterojunction bipolar transistor comprising the steps of:

(a) sequentially forming a first oxidation film, an electrically conducting film for a base and a second oxidation film on a semiconductor substrate formed as a buried collector;

(b) patterning the second oxidation film and the electrically conducting film, and forming a preliminary spacer at sides of an exposed portion of the second oxidation film and the electrically conducting film;

(c) removing an exposed portion of the first oxidation film, and selectively growing a collector layer on a defined active region such that its height is approximately similar to that of the conducting film for the base, and etching a first thickness of the second oxidation film and the preliminary spacer;

(d) oxidizing the collector layer to form a thermal oxidation film, and removing the preliminary spacer;

(e) depositing a polysilicon on a semifinished structure obtained from said step (d), and forming a silicon oxidation film and a polysilicon spacer on the second oxidation film and the removed portion of the preliminary spacer by using a thermal oxidation process, respectively;

(f) exposing the conducting film, the spacer and the collector layer, and forming a SiGe/Si base layer;

(g) forming a base electrode on the SiGe/Si layer;

(h) exposing a portion of the first oxidation film by using a mask defining the base electrode, and forming a third oxidation film;

(i) exposing a surface of the SiGe/Si layer by using a mask defining an emitter region, and forming an insulating spacer on sides of the exposed portion, and selectively growing an emitter layer on the defined emitter region, and forming an emitter electrode on the emitter layer; and (j) performing a metal wiring process.

2. The method of claim 1, wherein the semiconductor substrate is a silicon substrate.

3. The method of claim 1, wherein the semiconductor substrate is made of Si/ SiGe/ Ge heterojuction structure.

4. The method Of claim 1, wherein the semiconductor substrate is made of Si/ diamond layer/ Si or Ge heterojuction structure.

5. The method of claim 1, wherein the electrically conducting thin film for the base is made of a polysilicon, SiGe, or Ge doped an impurity in-situ.

6. The method of claim 1, which instead of the step (e) includes: forming a spacer composed of a polysilicon on a side portion adjacent to the conducting thin film and a spacer composed of a single crystal silicon on a side portion adjacent to the collector layer, by using the selectively epitaxial growing method at only the removed portion of the preliminary spacer, to thereby form a double-layer spacer structure.

7. The method of claim 1, wherein step (e), further includes: forming a SiGe layer at an interface of the SiGe/Si layer, thereby preventing the degradation of the performance of the transistor due to an occurrence of a parasitic electric potential.

8. The method of claim 1, wherein the base electrode is made of a silicide metal deposited by sputtering, to thereby minimize a parasitic resistance in the base.

* * * * *